United States Patent [19]

Kim

[11] 4,300,165
[45] Nov. 10, 1981

[54] DUAL MODE AUTOMATIC FINE TUNING

[75] Inventor: Seung K. Kim, Portsmouth, Va.

[73] Assignee: General Electric Company, Portsmouth, Va.

[21] Appl. No.: 67,506

[22] Filed: Aug. 17, 1979

Related U.S. Application Data

[63] Continuation of Ser. No. 894,608, Apr. 7, 1978, abandoned.

[51] Int. Cl.³ .............................................. H04N 5/44
[52] U.S. Cl. .................................................. 358/195.1
[58] Field of Search ............. 358/193.1, 192.1, 195.1; 455/31, 136, 150, 164, 173, 182, 192; 334/18; 307/227

[56] References Cited

U.S. PATENT DOCUMENTS

| | | | |
|---|---|---|---|
| Re. 27,329 | 4/1972 | Mayle | 358/193.1 |
| 2,910,530 | 10/1959 | Clark | 358/192.1 |
| 3,584,141 | 6/1971 | Fujiwara | 358/193.1 |
| 3,610,817 | 10/1971 | Bridgewater | 358/193.1 |
| 3,715,495 | 2/1973 | Takezaki et al. | 358/193.1 |
| 3,949,158 | 4/1976 | Rzeszewski et al. | 358/195.1 |
| 3,965,288 | 6/1976 | Yamada et al. | 358/193.1 |
| 3,967,057 | 6/1976 | Tsukamoto et al. | 358/193.1 |
| 4,025,953 | 5/1977 | Sideris | 358/195.1 X |
| 4,038,689 | 7/1977 | Rzeszewski et al. | 358/195.1 X |
| 4,041,535 | 8/1977 | Rzeszewski et al. | 358/195.1 X |

*Primary Examiner*—John H. Wolff
*Assistant Examiner*—Aristotelis M. Psitos

[57] ABSTRACT

A digital staircase search is provided for the automatic fine tuning (AFT) control of a television receiver to extend the range of fine tuning. The staircase search generator is of digital construction to provide the capability of holding the level of search voltage obtained when the picture carrier is detected and to realize discrete steps of tuning voltage change, each step being within the pull-in range of the AFT. The search signal generated has each step of the staircase of opposite polarity so that sweep of the tuning voltage is bi-directional. The absence of a picture carrier activates operation of the search mode and disables the automatic fine tuning control. Upon detection of the picture carrier a harmonic of the horizontal sync pulses in the detected carrier is converted to a control signal which disables the search process and enables operation of the automatic fine tuning control. The automatic fine tuning control operates from the step of the staircase held upon search termination.

10 Claims, 3 Drawing Figures

DUAL MODE AUTOMATIC FINE TUNING

This is a continuation of application Ser. No. 894,608, filed 4/7/78, now abandoned.

BACKGROUND OF THE INVENTION

The present invention relates to an automatic fine tuning control for a television receiver. More particularly, it relates to a dual mode fine tuning control for expanding the range of the fine tuning control without compromising the sensitivity thereof.

The ordinary automatic fine tuning control (AFT), also referred to as automatic frequency control (AFC), of a television receiver is responsive to the output of the IF stage in the video processing circuitry of the receiver and is tuned to 45.75 mc, the nominal frequency of the IF picture carrier. The automatic fine tuning control is a high gain frequency sensitive circuit producing a DC voltage proportional to the frequency shift of the output of the IF stage from the desired 45.75 mc. The DC voltage produced by the AFT is applied to the tuning circuits of the tuner to control the fine tuning thereof. Because the automatic fine tuning control cannot distinguish the picture carrier from the adjacent channel sound carrier, which is only 1.5 mc. away from the picture carrier of the channel selected, the normal pull-in range of the AFT is limited to approximately ±750 kc.

The problem encountered with such narrow range automatic fine tuning is that often the tuner is detuned substantially from the picture carrier of the channel selected so that a pull-in range of 750 kc. is not sufficient to find the picture carrier. Yet it is not sufficient to merely extend the range of this fine tuning control without having the tuner erroneously lock onto the adjacent channel sound carrier and without sacrificing fine tuning sensitivity. It is therefore necessary, if the range of the automatic fine tuning control is extended, to provide means to distinguish between the picture carrier and the adjacent channel sound carrier. Another problem encountered in attempting to expand the pull in range of AFT is the need to provide means to stop the searching process whenever the picture carrier is located and to hold the level fixed that was obtained in the searching process so that the automatic fine tuning control can operate from this fixed level to hold the tuner on the picture carrier.

It is accordingly an object of the present invention to provide an expanded range AFT that will not lock onto adjacent sound carriers.

Another object of the present invention is to provide a dual mode AFT wherein the AFT operation is defeated during searching and search is stopped and the AFT again enabled when the picture carrier is detected.

A further object is to provide a two stage AFT, the first step acting as coarse tuning to cause the tuner to seek the picture carrier and provide a fixed level to the tuner when the picture carrier is located, the second stage providing fine tuning about the fixed level.

A further object is to provide a digital bi-directional stepped search system for the AFT of a television receiver wherein upon detection of the picture carrier the search is stopped and held at the step obtained.

Another object is providing dual mode AFT having the transition between signal seeking and signal holding operation controlled by a harmonic of detected horizontal sync signals.

SUMMARY OF THE INVENTION

These objects are realized in a dual mode AFT system utilizing a digital bi-directional scan or search system in conjunction with the receiver's normal AFT so as to extend the range of the AFT without loss of sensitivity. The digital scan system enables both balanced bi-directional searching on either side of the normal IF picture carrier frequency and holding of the tuner at the tuning voltage level realized when the picture carrier is detected. The digital scan system comprises a clock generator which derives a 60 cycle clock signal from the 120 volt AC line, a binary counter and a ladder/summer network to derive a reversing steps staircase search signal.

The control signal to stop the search process and to enable the normal AFT to operate from the tuning voltage level realized by the search system is derived from the horizontal sync signals carried on the detected IF picture carrier. The third harmonic of the sync signals is obtained to provide the necessary constancy of signal which is then converted into the DC control signal used to control scan start/stop and AFT defeat/enable.

The aforenoted objects and other objects and features of the invention will be more readily understood from the following detailed description taken in conjunction with the drawings, in which.

DETAILED DESCRIPTION

Figure 1:
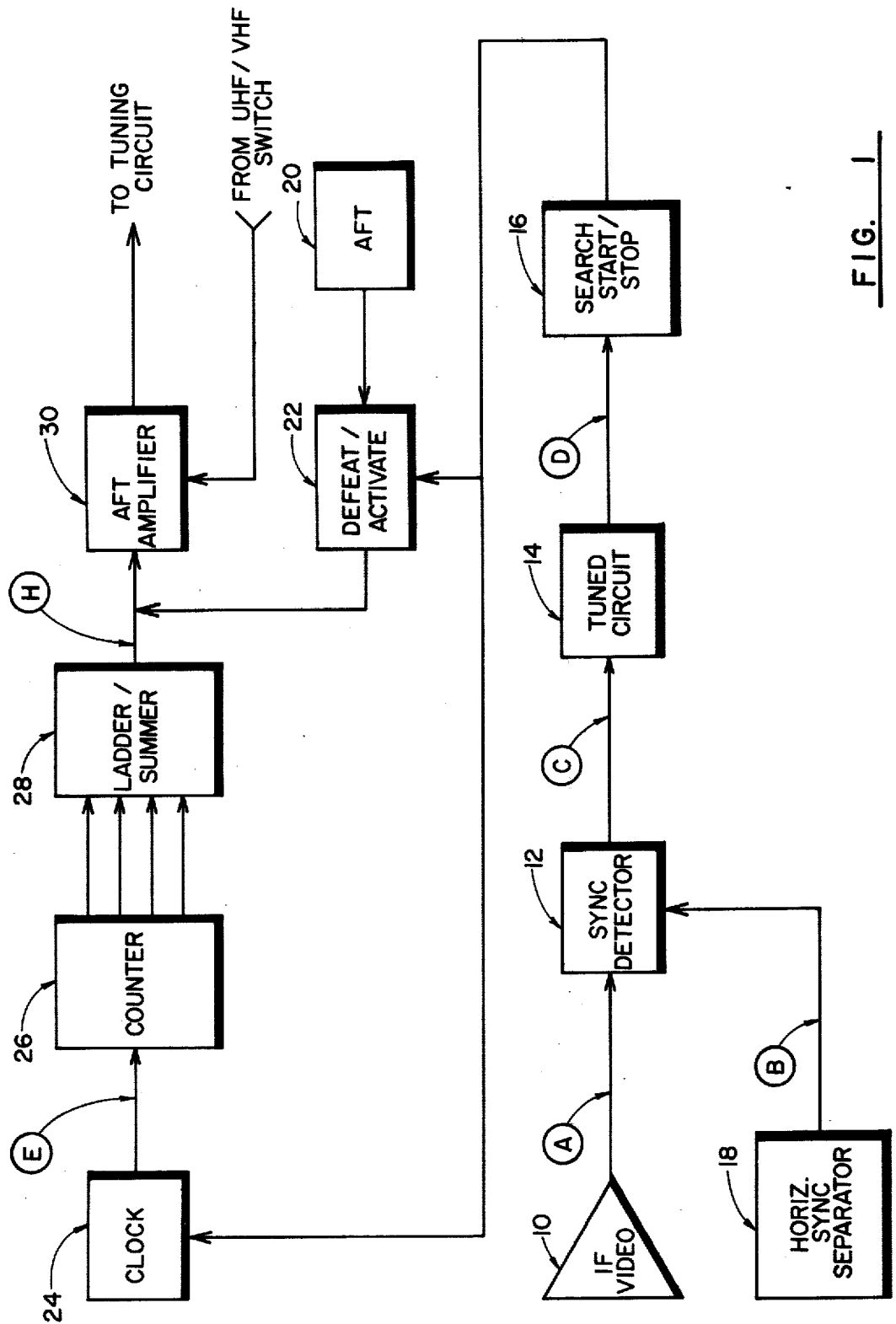
FIG. 1 is a block diagram of the dual mode AFT system in accordance with the present invention.

Referring now to FIG. 1, three of the blocks shown, the IF video amplifier 10, the horizontal sync separator 18 and the automatic fine tuning control 20, are ordinary components of televison receivers. The remaining blocks are components cooperating with the aforenoted components to form the dual mode automatic fine tuning control in accordance with the present invention.

The IF video amplifier 10 is contained in the IF stage of the signal processing system of the television receiver. The IF stage is responsive to the output of the tuner to provide the video IF and sound IF signals for the receiver. The IF video amplifier 10 provides narrow pass band amplification about the frequency of 45.75 mc., the nominal frequency of the IF picture carrier. The pass band of this amplifier is approximately ±750 kc,. the order of the pull-in range of the AFT circuit 20. Such a narrow pass band provides positive identification of detuning beyond the AFT pull-in range and the concomitant need for search to begin.

In accordance with the invention a sync detector 12 responds to the output of the video IF amplifier 10 to detect the presence of any horizontal sync pulses which, as is well known, are contained only on a picture carrier and not on the sound carrier. In accordance with one feature of the invention the detected horizontal sync pulses are used to create the control signal for controlling the operation of the dual mode AFT system to be described. Accordingly the tuned circuit 14 is tuned to the third harmonic of the detected sync pulses so as to provide a more consistent DC level indicative of the presence of the picture carrier then would be obtained from the fundamental frequency of the sync pulses themselves. This can be seen with reference to FIG. 3 where wave form C shows the detected horizontal sync pulses outputted by sync detector 12 and wave form D shows the third harmonic of the sync pulses as outputted by the tuned circuit 14. The search start/stop control 16 rectifies the third harmonic of the sync pulses to obtain a DC level that serves as the control signal to be applied to the defeat/activate switch 22 and to the clock 24, as will be described below.

The horizontal sync separator 18 of the television receiver applies horizontal sync pulses to the sync detector 12 simply as a gating signal to limit the conductive period of the sync detector and thereby minimize response by the detector to noise.

The two-fold application of the control signal from search control 16 to activate/defeat switch 22 and to clock 24 helps to identify the dual mode nature of the automatic fine tuning system in accordance with the invention. It can be seen that the automatic fine tuning control 20 is activated upon stopping of the search mode and is defeated upon starting of the search mode. When the modulated picture carrier does not appear at the output of IF amplifier 10 no control signal is provided at the output of search control circuit 16 and the search mode of operation is enabled. In this mode of operation clock 24 provides a series of pulses as shown by the wave form E in FIG. 3 to counter 26, which may be a binary counter made up of a series of two stage devices such as flip-flops to provide a series of square wave outputs, wherein each output, as is common with binary counters, differs by a factor of two in frequency from the output of the adjacent flip-flop. Of course, a binary counter is only one of many bistable devices that could be employed for this purpose.

Figure 3:
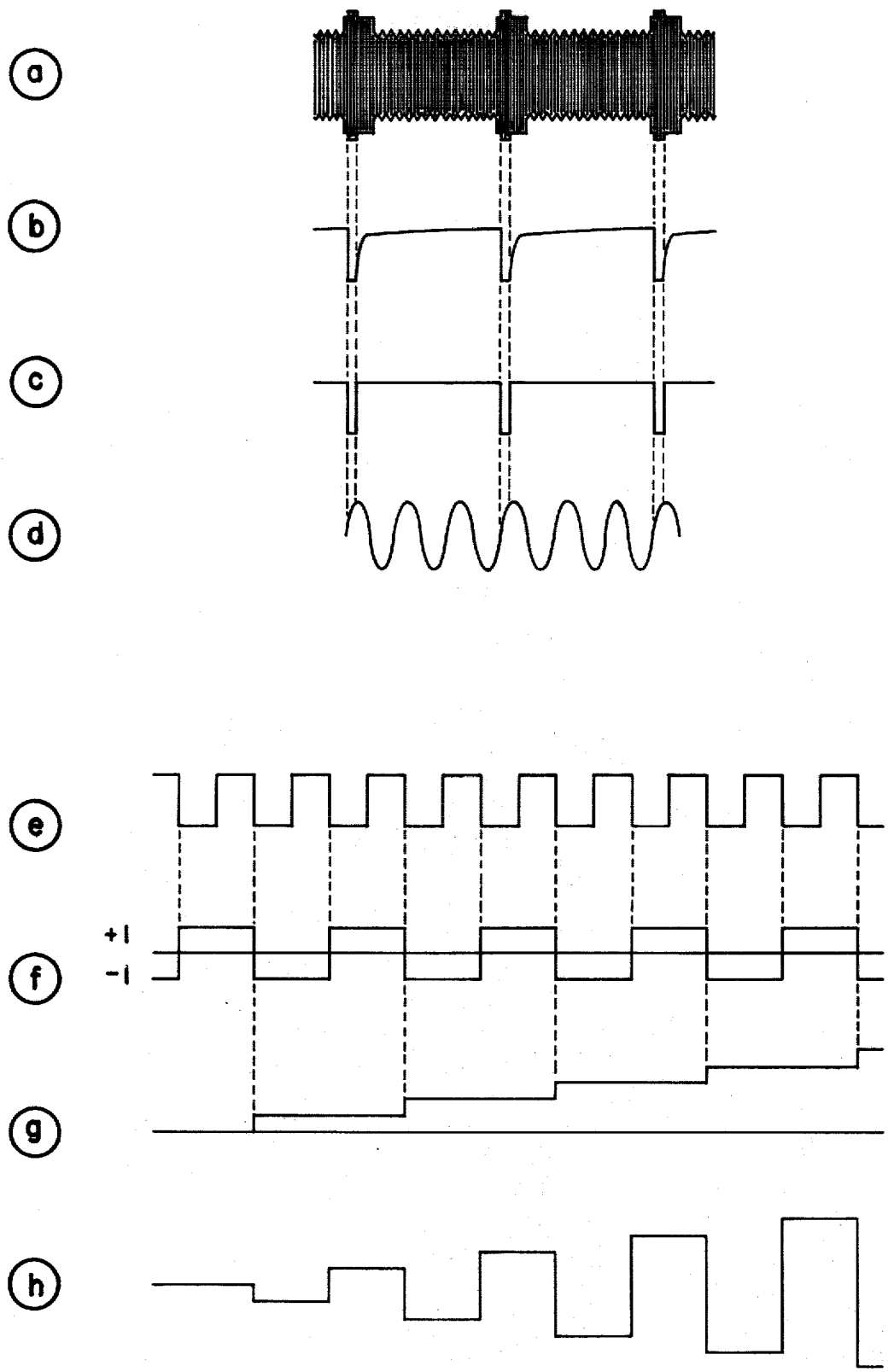
FIG. 3 is a series of graphs showing various wave forms at different points in the AFT system shown in FIGS. 1 and 2.

The outputs of the counter 26 are applied to ladder/summer network 28 which provides a staircase type sweep signal wherein each of the steps of the staircase is of opposite polarity as is shown in wave form H of FIG. 3. The resultant search signal from ladder/summer 28 and the signal from AFT 20, when it is activated by the switch 22, is applied to the tuning circuit of the tuner (not shown) by AFT amplifier 30. AFT amplifier 30 is shown as being responsive to an input from the UHF/VHF band switch so that the gain of this amplifier is controlled as a function of whether the UHF or VHF band is being tuned.

Figure 2:
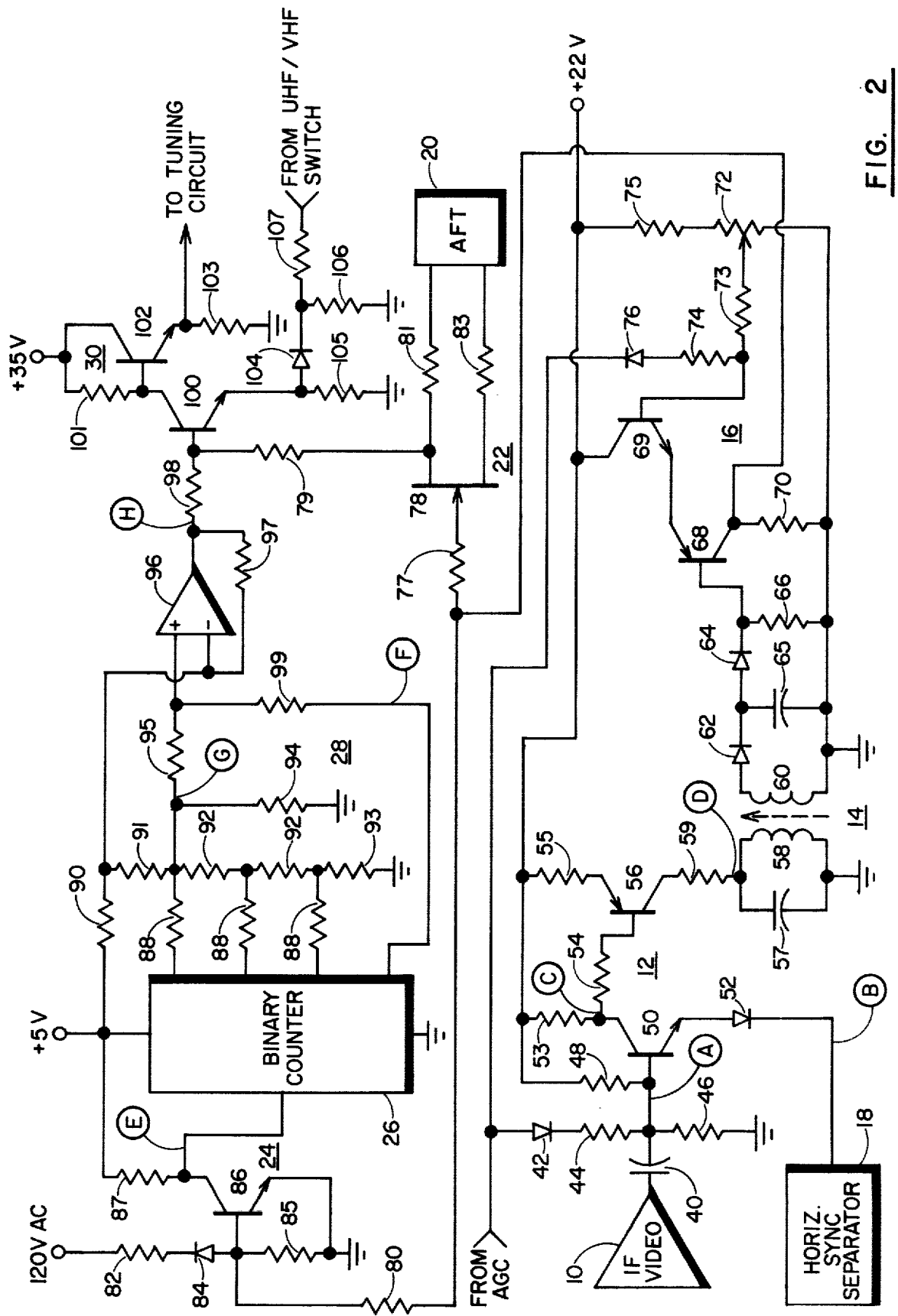
FIG. 2 is a schematic drawing of the dual mode AFT system in accordance with the present invention.

Looking now to FIG. 2, a preferred embodiment of the circuitry of the present invention is shown. FIG. 2 shows that the output of the IF video amplifier 10 is applied by coupling capacitor 40 to the base of detector transistor 50 which is biased by means of biasing resistors 46 and 48 to detect the horizontal synchronizing pulses. Resistors 46 and 48 are connected between the positive supply voltage 22 volts and ground, the junction of these two resistors being at the base of transistor 50. Resistor 53 couples the collector of transistors 50 to the positive 22 volt supply. The wave form applied to the base of transistor 50 from the IF video amplifier 10 is shown in FIG. 3 as the wave form A which represents the video carrier with the large amplitude sync pulses being readily observed. The output at the collector of transistors 50 can be seen as wave form C in FIG. 3.

It is noted that the diode 52 couples the emitter of transistor 50 to receive horizontal sync pulses indicated by wave form B from the horizontal sync separator 18. These sync pulses applied at the emitter of transistor 50 serve only as a gating input to enable transistor 50 to conduct only during the period when sync pulses are present on the video carrier. This limited period of conduction of detector transistor 50 greatly reduces susceptibility of the system to noise. Diode 52 serves to protect the emitter-base junction of transistor 50 against reverse breakdown.

Diode 42 and resistor 44 couple voltage from the automatic gain control circuit of the television receiver to change the bias voltage to transistor 50 in accordance with the strength or weakness of the incoming signal. In the presence of a weak signal the bias voltage of transistor 50 is increased and conversely in the presence of a strong signal the bias voltage is reduced. The diode 42 prevents the output of the video amplifier from being applied back to the automatic gain control circuit in the event this output is more positive than that appearing at the output of the automatic gain control.

The detected horizontal sync pulses at the collector of transistor 50 are applied to the base of transistor 56 which comprises a tuned amplifier including collector circuit capacitor 57 and inductor 58 tuned to the third harmonic of the horizontal sync pulses. Base coupling resistor 54, collector resistor 55 and emitter resistor 59 provide bias for transistor 56 and in conjunction with the capacitor 57 and the inductor 58 complete the tuned circuit. Inductor 58 forms the primary winding of an adjustable ferrite core transformer, the secondary winding thereof being winding 60.

The search start/stop control circuit 16 receives its input by means of secondary winding 60. The third harmonic wave form D appearing across winding 60 is rectified by diode 62 and applied to capacitor 65 where it is stored as the DC control voltage to control the ON/OFF operation of switch transistor 68. The DC control voltage is applied to the base of transistor 68 by diode 64. Resistor 66, coupling the base of transistor 68 to ground, provides a base current path for this transistor. When the DC control voltage is higher than the sensitivity threshold voltage set by potentiometer 72 and applied to the emitter of transistor 68 by current source transistor 69, transistor 68 is turned off and the normally high voltage appearing across resistor 70 falls to zero to indicate the receipt of a video carrier. The voltage set by the potentiometer 72 determines the threshold or, in other words, the sensitivity of the detection system. The higher the potentiometer is set the larger is the voltage that must appear at capacitor 65 in order to turn off the normally conducting transistor 68.

Diode 76 and resistor 74 connected to the base of transistor 69 and to the automatic gain control voltage serve much the same function as the diode 42 and resistor 44 do for transistor 60. Thus when a strong signal is received the AGC voltage will be lowered and diode 76 will conduct to lower the threshold voltage appearing at the base of transistor 69 so that transistor 68 can be turned off by a lower voltage across the capacitor 65. The end result of the AGC action on transistors 50 and 68 is that consistent performance can be realized in the detector and control circuit regardless of the strength of the signal being received.

When transistor 68 is conducting the voltage across resistor 70 is a positive voltage that is applied both to the gate of junction field effect transistor 78 and to the base of clock transistor 86. This positive voltage causes the J-FET 78 to conduct thereby shorting the normal AFT voltage from AFT circuit 20. Also, the positive voltage from resistor 70 when applied to the base of transistor 86 enables the clock transistor to conduct, as described below. When the voltage across resistor 70 is in the zero state, indicating the presence of a video carrier, FET 78 is turned off so that the output of AFT 20 is applied to the base of transistor 100. Likewise clock transistor 86 is turned off in the absence of the positive voltage applied to its base and the search operation is stopped. It can be seen that FET 78 together with clock transistor 86 form, switch means controlled by the voltage across resistor 70.

Turning now to the search portion of the AFT system, in accordance with the present invention the clock transistor 86 receives not only positive or zero voltage levels from resistor 70 but also a large amplitude pulsating signal from the b 120 volt AC line via resistor 82 and diode 84, resistors 82 and 85 acting as a voltage divider for applying the proper portion of this voltage to the base of transistor 86. In the presence of the positive voltage from resistor 70 transistor 86 will conduct except during the negative half cycles of the AC voltage which is of sufficiently high amplitude to produce a negative voltage at the base of this transistor. During the positive half cylces of the 120 VAC, diode 84 is non-conductive and the transistor sees only the positive voltage from resistor 70 and accordingly will conduct. Thus, transistor 86 provides a 60 cycle clock, the voltage output of which, shown as wave shape E in FIG. 3, is applied to the binary counter 26.

Binary counter 26 produces several outputs as shown, there being 4 flip-flops in the binary counter in the preferred embodiment of this invention. However, different number of flip-flops or other bistable devices could be employed, taking into consideration the fineness or coarseness of the search steps desired. The coarseness of the search steps would be limited to not exceeding the pull-in range of AFT 20 for the worse case channel. The output of the first flip-flop is shown as wave form F which is a signal of half the frequency of the applied clock. Wave form F is preferably shown having negative and positive excursions between +1 volt and −1 volt. The other three outputs of binary counter 26 are applied to a standard R, 2R resistor ladder network 28 comprising resistors 88 and 92 with resistors 90, 91 and 93 providing the bias for the ladder network, the resistors 88 being twice the value of resistors 92. This ladder combines the voltage outputs of the counter in well known fashion to produce the wave form G shown in FIG. 3, a staircase wave form from the accumulation of the various voltage outputs from the counter as appearing across resistor 94. This staircase wave form is applied to an adder comprising resistors 95 and 99 and operational amplifier 96 to provide at the output of this amplifier the desired search wave form which is an increasing staircase function H each step of the staircase being of opposite polarity. This wave form is formed by the addition of the versing signal waveform F with the staircase step signal waveform GC5, the reversing signal wave form F controlling the positive or negative mode of conduction of amplifier 96 and the staircase signal wave form G determing the amplitude of the output wave form H.

In the preferred embodiment for obtaining a balanced, bi-directional search waveform, a square wave reversing signal is combined with a stepped staircase signal to produce the reversing steps staircase search waveform H in FIG. 3. It is to be noted that the invention is not limited to this particular search waveform. Other signals are capable of providing the desired balanced, bi-direction search waveform. For example, instead of the increasing search function provided by the staircase waveform G, a continuous ramp-like waveform could be combined with the reversing signal. The resulting signal would again be a balanced, bi-directional search waveform but in this case the steps or plateaus would be ramp like steps instead of horizontal steps.

The search signal H is applied to amplifier stage 30 made up of transistors 100 and 102. The transistor 100 is a DC amplifier and transistor 102 is an emitter follower. The transistor amplifier 100 has its gain substantially determind by the ratio of resistors 101 to 105 and this gain is altered by having resistor 106 being switched in parallel with resistor 105 upon receipt of a zero volt VHF band signal from the UHF/VHF switch to cause diode 104 to conduct. This increases the gain of the amplifier for the VHF band of channels. Amplifier 30 applied either the search signal voltage or both the held search signal voltage and the AFT voltage to the tuning circuit of the television receiver's tuner to maintain the receiver tuned to the picture carrier of the channel selected.

It can be seen from the foregoing that in the absence of detection of the horizontal sync pulses of a video carrier, the positive voltage appearing across resistor 70 defeats the normal AFT action of the receiver and enables the digital scan to begin its search function. Upon receipt of a video carrier the searching is stopped and because of the digital nature of the scan the voltage level obtained is held and the AFT is allowed to operate as a vernier about the held level to hold the tuner at the picture carrier. While there are many variations of circuitry that can be utilized to accomplish the objects of the invention as set forth, it is intended that the foregoing detailed description be not taken by way of limitation and that the scope of the invention be determined solely by the appended claims.

What is claimed and desired to be secured by Letters Patent of the United States is:

1. In a television receiver having automatic fine tuning means for causing the tuner of said television receiver to seek and hold the picture carrier for the channel selected, a search system for extending the pull-in range of said automatic fine tuning means comprising:
   search means for generating a reversing steps staircase search signal,
   control means responsive to synchronizing pulses carried by said picture carrier to develop a control signal therefrom,
   switch means coupled to said automatic fine tuning means and to said search means and responsive to said control signal to activate said search means and defeat said automatic fine tuning means in the absence of a control signal and to cause said search means to hold at the level of search signal attained said to activate said automatic fine tuning means upon the presence of said control signal, and
   means coupling said search means and said automatic fine tuning means to said tuner so that said search signal serves as a coarse adjustment of said tuner within the channel selected to bring said tuner within the pull-in range of said automatic fine tuning means, said automatic fine tuning means utilizing the held level of said search singal as a reference to fine tune said tuner about said held level.

2. The invention recited in claim 1, wherein said search means comprise:
   means for generating a staircase step signal, means for generating a reversing signal, and means for combining said staircase step signal and said reversing signal to obtain said reversing steps staircase search signal.

3. The invention recited in claim 2, wherein said search means comprise:

clock signal generating means, digital counting means responsive to said clock signal to generate several output signals, said reversing signal being one of said outputs, and means responsive to the other outputs of said digital counting means to generate said staircase step signal.

4. The invention recited in claim 3, wherein said switch means is coupled to said clock means to stop said clock upon the presence of said control signal so that said digital counting means is stopped at the step generated upon receipt of the indication of the presence of the picture carrier by said control signal, said stopped at step providing a reference level for said automatic fine tuning means to fine tune said tuner.

5. The invention recited in claim 4, wherein said television receiver is powered by an AC line voltage and said clock means is responsive to said AC line voltage and to the absence of said control signal to generate said clock signal, said clock signal having a frequency derived from said AC line voltage.

6. The invention recited in claim 1, wherein said control means includes sync detecting means tuned to respond to the presence of said picture carrier and to detect the horizontal synchronizing pulses contained on said picture carrier, and means to generate said control signal from a harmonic frequency of said horizontal synchronizing pulses.

7. The invention recited in claim 6, wherein said television receiver includes sync separating means to separate the horizontal and vertical synchronizing pulses from said picture carrier and wherein the sync detecting means of said control means includes gated means coupled to said sync separating means and being gated into conduction only during the presence of each horizontal synchronizing pulse outputted by said sync separating means.

8. In a television receiver having a tuner for selecting the various channels for television viewing, dual mode automatic fine tuning means for said tuner for seeking the picture carrier for the selected channel and holding said tuner on said picture carrier, said dual mode automatic fine tuning means comprising:

first automatic fine tuning means coupled to said tuner and responsive to the frequency of said picture carrier to generate a fine tuning control signal for holding said tuner on said picture carrier, second automatic fine tuning means comprising digital search signal generating means generating a reversing step polarity staircase search signal, means coupling said search signal and said fine tuning signal to said tuner, and control means responsive to the presence and absence of said picture carrier and coupled to said first and second automatic fine tuning means to inhibit operation of said first automatic fine tuning means and enable said second automatic fine tuning means to generate said search signal in the absence of said picture carrier, and to stop and hold said second automatic fine tuning means at the step of said staircase search signal generated and to enable said first automatic fine tuning means upon the presence of said picture carrier, said first automatic fine tuning means thereby fine tuning said tuner about the level of the stopped and held step.

9. The invention recited in claim 8, wherein said second automatic fine tuning means comprise:

digital counting means generating a staircase signal and a reversing signal, and means coupled to said digital counting means to combine said staircase signal with said reversing signal so that each successive step of said staircase signal is of opposite polarity.

10. In a television receiver having a tuner for selecting the various channels for television viewing, a dual mode automatic fine tuning system for said tuner for seeking the picture carrier for the selected channel in the first mode of operation and holding said tuner on said picture carrier in the second mode of operation, said dual mode automatic fine tuning system comprising:

detecting means responsive to the sync pulses of said picture carrier to detect the presence of said picture carrier, control means coupled to said detecting means and responsive to said sync pulses to develop a control signal therefrom, automatic fine tuning means coupled to said tuner and responsive to the frequency of the picture carrier when detected to develop a holding signal for holding said tuner on said picture carrier, search means for expanding the pull-in range of said automatic fine tuning means comprising means generating a periodic reversing signal, means generating an increasing amplitude signal and means to combine the reversing signal with the increasing amplitude signal to produce a periodically bidirectional increasing level search signal, switch means for enabling and disabling said search signal and said holding signal from being applied to said tuner, said switch means being coupled to said control means and responsive to said control signal to disable application of said holding signal to said tuner and to enable generation of said periodically bidirectional increasing level search signal for said tuner in the absence of detection of said picture carrier and to stop the search process at the level of said search signal achieved and to enable said holding signal to be applied to said tuner upon the detection of the presence of said picture carrier, said automatic fine tuning means thereby causing said tuner to fine tune about the attained level of said search signal.

* * * * *